(12) United States Patent
Murakami et al.

(10) Patent No.: US 9,865,358 B2
(45) Date of Patent: Jan. 9, 2018

(54) FLASH MEMORY DEVICE AND ERASE METHOD THEREOF CAPABLE OF REDUCING POWER CONSUMPTION

(71) Applicant: Winbond Electronics Corp., Taichung (TW)

(72) Inventors: Hiroki Murakami, Taichung (TW); Kenichi Arakawa, Taichung (TW)

(73) Assignee: Windbond Electronics Corp., Taichung (TW)

( * ) Notice: Subject to any disclaimer, the term of this patent is extended or adjusted under 35 U.S.C. 154(b) by 0 days.

(21) Appl. No.: 15/435,985

(22) Filed: Feb. 17, 2017

(65) Prior Publication Data

US 2017/0243656 A1 Aug. 24, 2017

(30) Foreign Application Priority Data

Feb. 18, 2016 (JP) ................. 2016-028483

(51) Int. Cl.
*G11C 16/04* (2006.01)
*G11C 16/34* (2006.01)
*G11C 16/10* (2006.01)
*G11C 16/14* (2006.01)
*G11C 16/26* (2006.01)

(52) U.S. Cl.
CPC ...... *G11C 16/3445* (2013.01); *G11C 16/0483* (2013.01); *G11C 16/10* (2013.01); *G11C 16/14* (2013.01); *G11C 16/26* (2013.01)

(58) Field of Classification Search
CPC ..... G11C 16/3445; G11C 16/26; G11C 16/14; G11C 16/0483; G11C 5/147; G06F 12/0246
USPC .......................... 365/185.29, 185.22, 189.09
See application file for complete search history.

(56) References Cited

U.S. PATENT DOCUMENTS

| 7,808,829 | B2 * | 10/2010 | Lee ............... G11C 16/0483 365/185.11 |
| 8,339,183 | B2 | 12/2012 | Htoo et al. |
| 2011/0116322 | A1 | 5/2011 | Seol et al. |

FOREIGN PATENT DOCUMENTS

| JP | 2000322893 A | 11/2000 |
| JP | 2012027979 A | 11/2000 |

* cited by examiner

*Primary Examiner* — David Lam
(74) *Attorney, Agent, or Firm* — Muncy, Geissler, Olds & Lowe, P.C.

(57) ABSTRACT

Provided is a flash memory device capable of restricting power consumption in an erase operation. The invention includes a plurality of wells, a power supply device, and a coupling device. The power supply device applies erase voltages to the wells for performing an erase operation. The coupling device performs selective coupling between the wells. When performing the erase operation on the wells, the power supply device applies the erase voltage to one of the wells, and applies the erase voltage to the other one of the wells after the coupling device electrically couples the one of the wells to the other one of the wells.

12 Claims, 9 Drawing Sheets

|  | erase voltage | write voltage | read voltage |
|---|---|---|---|
| selected W/L | 0 | 15~20V | 0 |
| unselected W/L | F | 10V | 4.5 |
| SGD | F | Vcc | 4.5 |
| SGS | F | 0 | 4.5 |
| SL | F | Vcc | 0 |
| P well | 21 | 0 | 0 | charge sharing is not performed

| | TP1 | TP2 | TP3 | TP4 |
|---|---|---|---|---|
| memory plane 110L | erase | verification | – | – |
| memory plane 110R | verification | erase | verification | erase |

| $0 < V_W$ | transistor Q3/Q7 on |
| Vcc $\leqq$ $V_W$ | transistor Q4/Q8 on |
| VPASS $\leqq$ $V_W$ | transistor Q5/Q9 on |

FLASH MEMORY DEVICE AND ERASE METHOD THEREOF CAPABLE OF REDUCING POWER CONSUMPTION

CROSS REFERENCE TO RELATED APPLICATIONS

This Application claims priority of Japan Patent Application No. 2016-028483, filed on Feb. 18, 2016, the entirety of which is incorporated by reference herein.

BACKGROUND OF THE INVENTION

Field of the Invention

The application relates in general to a semiconductor device, in particular to a method for erasing NAND-type or NOR-type flash memory.

Description of the Related Art

The programming of a flash memory can allow electrons to accumulate in the floating gate, which shifts the threshold voltage of the memory cell in the positive direction. On the other hand, erasing is meant to release electrons from the floating gate, which shifts the threshold voltage of the memory cell in the negative direction. A typical erase method for a NAND-type flash memory is to apply 0V to the word line of the selected block, float the word line of the unselected block, and apply the erase voltage to the well, thereby erasing data from the memory cells in the selected block. The erase verification determines whether the entire bit line or all the NAND strings of the selected block are qualified, and if an unqualified bit line exists, then it will be applied with the erase voltage again. Refer to Japanese Patent No. 5565948.

BRIEF SUMMARY OF INVENTION

The Problems Need to be Solved

In a conventional flash memory, when a plurality of memory planes are formed so as to sandwich a word line selecting circuit, all the memory cells of each memory plane can be erased at the same time. That is, the word line of the selected block is set to 0V by using the word line selecting circuit, and the erase voltage is applied to the wells of each memory plane, thereby simultaneously erasing the selected blocks of each memory plane. However, with the increase of integration, the number of blocks and the number of memory cells are increased, and the capacity of a well area is also increased. As a result, the rapid charge of a well is required to have a better driving capability, resulting in the area occupied by the circuit becoming larger. On the other hand, when the driving capacity is limited, the time for charging the wells becomes longer. In a normal erase operation, the erasing and the erase verification are repeated, which means that the erase voltage will once again be charged to the wells after the erase voltage is discharged to the ground. The repeat of this operation results in a problem wherein power consumption is high when an erase operation is performed.

The purpose of the present invention is to provide a flash memory device that can solve the problem described above, and restrict the power consumption of the erase operation.

Means for Solving Problems

The present invention provides an erase method for a flash memory having a plurality of wells with memory cells formed therein, including: applying an erase voltage to one of the wells; discharging the erase voltage from the one of the wells to the other one of the wells electrically coupled with the one of the wells; applying the erase voltage to the other one of the wells; and performing an erase verification on the memory cells formed in the one of the wells and the memory cells formed in the other one of the wells at the same time.

Ideally, the erase method includes the step of electrically decoupling the qualified wells and the unqualified wells and applying the erase voltage to the unqualified wells when the erase verification of any one of the wells is qualified. Ideally, the erase method includes the step of detecting the voltage of the other one of the wells applied with the erase voltage discharging from the one of the wells; and selecting a power supply source for applying the erase voltage to the other one of the wells based on the detected voltage.

The present invention provides an erase method for a flash memory having a plurality of wells with memory cells formed therein, including: applying an erase voltage to one of the wells; discharging the erase voltage of the one of the wells to the other one of the wells electrically coupled with the one of the wells; applying the erase voltage to the other one of the wells; and applying the erase voltage to the other one of the wells and performing an erase verification on the one of the wells during the same period.

Ideally, the erase method further includes the step of electrically decoupling qualified wells and unqualified wells and applying the erase voltage to the unqualified wells when the erase verification of any one of the wells is qualified. Ideally, when the erase verification of the one of the wells is unqualified, the erase method further includes the steps of electrically coupling the one of the wells and the other one of the wells again for discharging the erase voltage of the other one of the wells to the one of the wells; and performing the erase verification on the other one of the wells and applying the erase voltage to the one of the wells again during the same period.

The present invention provides a flash memory device, including: a plurality of wells comprising a plurality of memory cells, a detecting device, a power supply device, and a coupling device. The detecting device detects the voltage of a selected one of the wells. The power supply device applies an erase voltage to the selected one of the wells. The coupling device performs selective couplings between the wells. When performing an erase operation on the wells, the power supply device applies the erase voltage to one of the wells, and applies the erase voltage to the other one of the wells based on the detected voltage of the other one of the wells after the coupling device has electrically coupled the one of the wells to the other one of the wells.

Ideally, the flash memory device further includes a control device applying a control signal to the coupling device, the coupling device includes at least one transistor connecting the one of the wells to the other one of the wells, and when the transistor is turned on according to the control signal for a certain period of time after the erase voltage is applied to the one of the wells, the erase voltage of the one of the wells is discharged to the other one of the wells. Ideally, the power supply device comprises a plurality of transistors connecting to a plurality of power supply sources, and applies a selected voltage from one of the power supply sources to the selected one of the wells according to the control signal. Ideally, the memory cells formed in the one of the wells and the memory cells formed in the other one of the wells are connected by a common word line. Ideally, while the power supply device is applying the erase voltage to the other one of the wells, an erase verification of the one of the wells is performed.

The Effects of the Invention

According to the present invention, the erase voltage applied to the one of the wells is discharged to the other one of the wells in order to have a common erase voltage between the wells, and that is able to restrict the consumption of the erase voltage during the erase operation. In addition, performing the erase verification on the other one of the wells while performing the erase operation on the one of the wells is able to shorten the time for performing the erase operation.

Hereafter, the embodiments of the present invention will be described in detail with reference to the drawings. Here, the NAND type flash memory is illustrated as being in an ideal state. Also, to facilitate understanding, the schema is illustrated in a way that emphasizes the parts. It should be noted that the size of the parts are not the same size as the actual device.

DETAILED DESCRIPTION OF INVENTION

Figure 1:
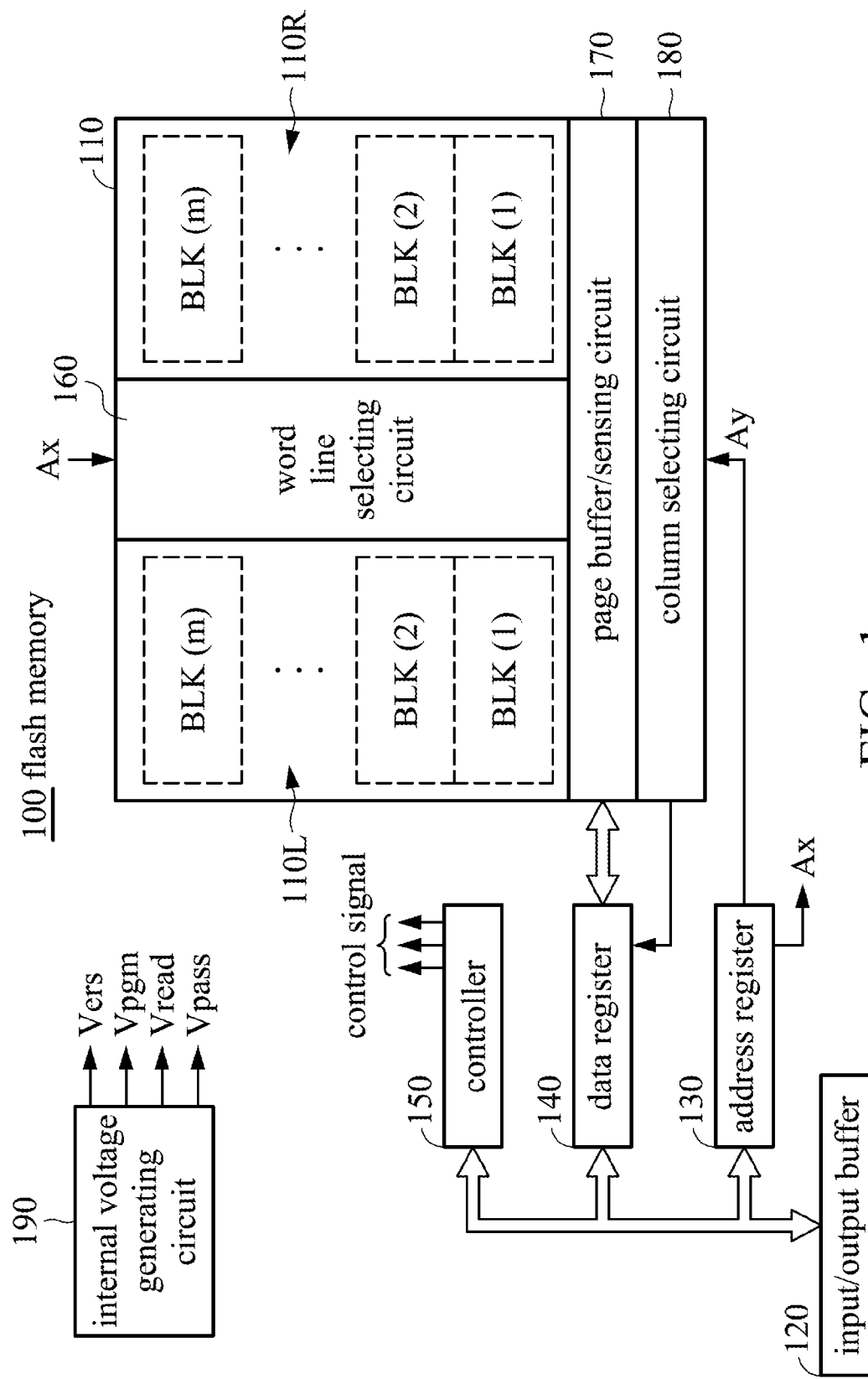
FIG. 1 illustrates an overall outline structure of a NAND type flash memory in accordance with an embodiment of the inventive.

FIG. 1 illustrates a block diagram of a typical structure of a NAND type flash memory in accordance with an embodiment of the present invention. However, the structure of the flash memory shown here is only an example, and the present invention is not limited thereto. As shown in FIG. 1, the flash memory 100 includes a memory array 110, an input/output buffer 120, an address register 130, a data register 140, a controller 150, a word line selecting circuit 160, a page buffer/sensing circuit 170, a column selecting circuit 180 and an internal voltage generating circuit 190. The memory array 110 includes a plurality of memory cells arranged in rows and columns. The input/output buffer 120 connects to the external input/output terminal I/O and keeps inputting/outputting data. The address register 130 receives the address data from the input/output buffer 120. The data register 140 transmits and receives the data between the input/output buffer 120. The controller 150 receives the command data from the input/output buffer 120 and the control signal from outside to control the parts. The word line selecting circuit 160 receives the row address information Ax from the address register 130, decodes the row address information Ax, and performs block selection and word line selection based on the decoding result. The page buffer/sensing circuit 170 keeps the data read from the page selected by the word line selecting circuit 160, and keeps the write data of the selected page. The row selecting circuit 180 receives the column address information Ay from the address register 130, decodes the column address information Ay, and performs selection of the data in the page buffer/sensing circuit 170 based on the decoding result. The internal voltage generating circuit 190 generates various voltages (write voltage Vpgm, pass voltage VPASS, read voltage Vread, erase voltage Vers, etc.) for reading data, programming (writing) and erasing.

The memory array 110 is provided on both sides of the word line selecting circuit 160, including, for example, two memory planes 110L, 110R. One memory plane includes a plurality of blocks arranged in one well. One well, for example, is formed in a P-type well in an N-type silicon substrate or in a well. In one memory plane, m memory blocks BLK (1), BLK (2) . . . BLK (m) are formed in a row.

Figures 2, 3:
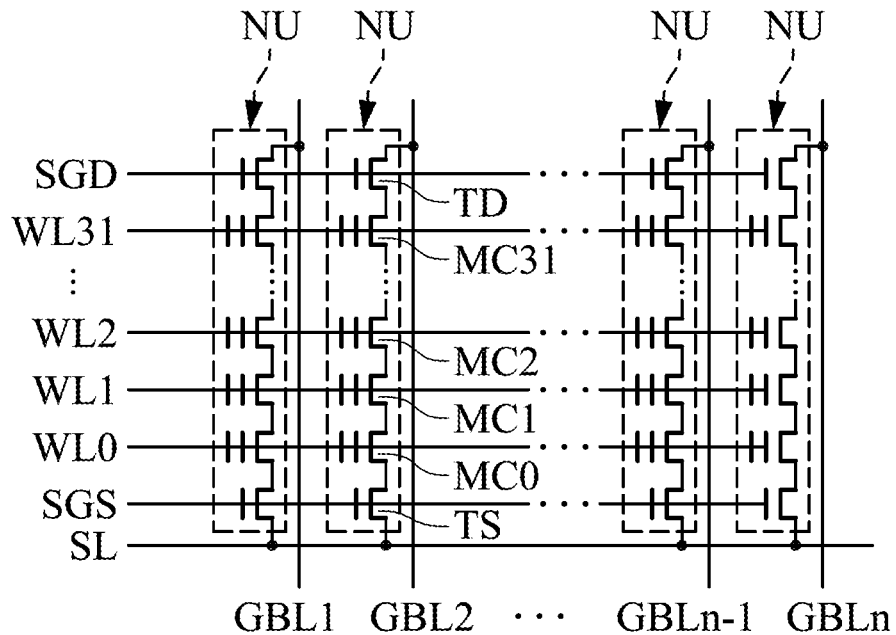
FIG. 2 illustrates a circuit diagram of the NAND string structure.
FIG. 3 illustrates an example diagram of a bias voltage applied in various operations of the flash memory.

In one memory block, as shown in FIG. 2 for example, a plurality of NAND strings NU are formed, and each NAND string NU includes a plurality of memory cells connected in series. One memory block has n NAND strings NU that are arranged in a column direction. The NAND string NU includes a plurality of memory cells MCi (i=0, 1, . . . , 31) connected in series, a bit line side select transistor DT connected to a drain side of the memory cell MC31 located at one end, and a source line side select transistor TS connected to a source side of the memory cell MC0 located at the other end. A drain of the bit line side select transistor TD is connected to a corresponding bit line GBL, and a source of the source line side select transistor TS is connected to a common source line SL.

A control gate of the memory cell MCi is connected to the word line WLi, and the bit line side select transistor TD and a gate of the source line side select transistor TS are connected to selection gate line SGD, SGS which are parallel to the word line WLi respectively. The word line selecting circuit 160 selectively drives the selection gate lines SGS, SGD, and the character line WL to H-level based on the row address Ax or the transformed address to select blocks and pages of the left and right memory planes 110L, 110R. FIG. 2 illustrates a typical memory cell unit, but the memory cell unit may contain one or a plurality of virtual memory cells in the NAND string, and the NAND string may be a three-dimensional structure formed on the substrate.

The memory cell typically has a MOS structure, including: a source/drain formed in the P-well which is an N-type diffusion region, a tunnel oxide film formed on a channel between the source/drain, a floating gate (charge accumulation layer) formed on the tunnel oxide film, and a control gate formed on the floating gate through a dielectric film. When the floating gate does not accumulate any charge, that is, when the data "1" is written, a threshold value is in a negative state, the memory cell is in a normally ON state.

When the floating gate accumulates a charge, that is, when the data "0" is written, the threshold value is transferred to a positive state, the memory cell is in a normally OFF state. The memory cells can be an SLC type that stores 1-bit data (2-values data), or can be an MLC type that stores multi-bit data.

FIG. 3 illustrates an example diagram of a bias voltage applied in various operations of the flash memory. In the erase operation, 0V is applied to the word line of the selected block in the P-well, the word line of the unselected block is set to the floating state, and a high voltage of, for example, 21V is applied to the P-well to pull electrons out of the floating gate of the memory cell to erase the data.

The flash memory 100 of the embodiment has a circuit for sharing the charge formed between the wells of the memory planes. Please refer to FIG. 4, the flash memory 100 is provided with a coupling device 200 capable of electrically coupling to a P-type well 210L forming a memory plane 110L and a P-type well 210R forming a memory plane 110R. As described below, by using the coupling device 200, when the selected blocks of the memory planes 110L, 110R are erased, the erase voltage accumulated in one of the wells can be discharged to the other one of the wells which should be applied with the erase voltage to achieve the purpose of sharing the erase voltage between the two wells. The coupling device 200 of the embodiment includes, for example, at least one NMOS transistor Q1, and a control signal S1 is supplied from the controller 150 to a gate of the transistor Q1. When the control signal S1 is driven to an H-level, two wells 210L and 210R are electrically coupled.

The well 210L is connected to a voltage circuit 220L that applies a voltage required for the well or discharges the voltage of the well. The voltage circuit 220L, for example, includes a plurality of N-type transistors Q2, Q3, Q4, Q5. The control signals S2, S3, S4, S5 from the controller 150 are supplied to the N-type transistors Q2, Q3, Q4, Q5, respectively. The transistor Q2 is connected to GND, and when the transistor Q2 is turned on, the charge accumulated in the well 210L are discharged to the GND. The transistor Q3 is connected to Vcc voltage (e.g., 3.3 V), and when the transistor Q3 is turned on, the well 210L is supplied with Vcc voltage. The transistor Q4 is connected to VPASS (e.g., 10 V), and when the transistor Q4 is turned on, the well 210L is supplied with VPASS voltage. The transistor Q5 is connected to WWW voltage (a high voltage for erasing), and when the transistor Q5 is turned on, the well 210L is supplied with WWW voltage. WWW voltage is generated, for example, by a charge pump circuit or the like. The well region 210R is also connected to the voltage circuit 220R having the same structure as the voltage circuit 220L.

Figure 5:
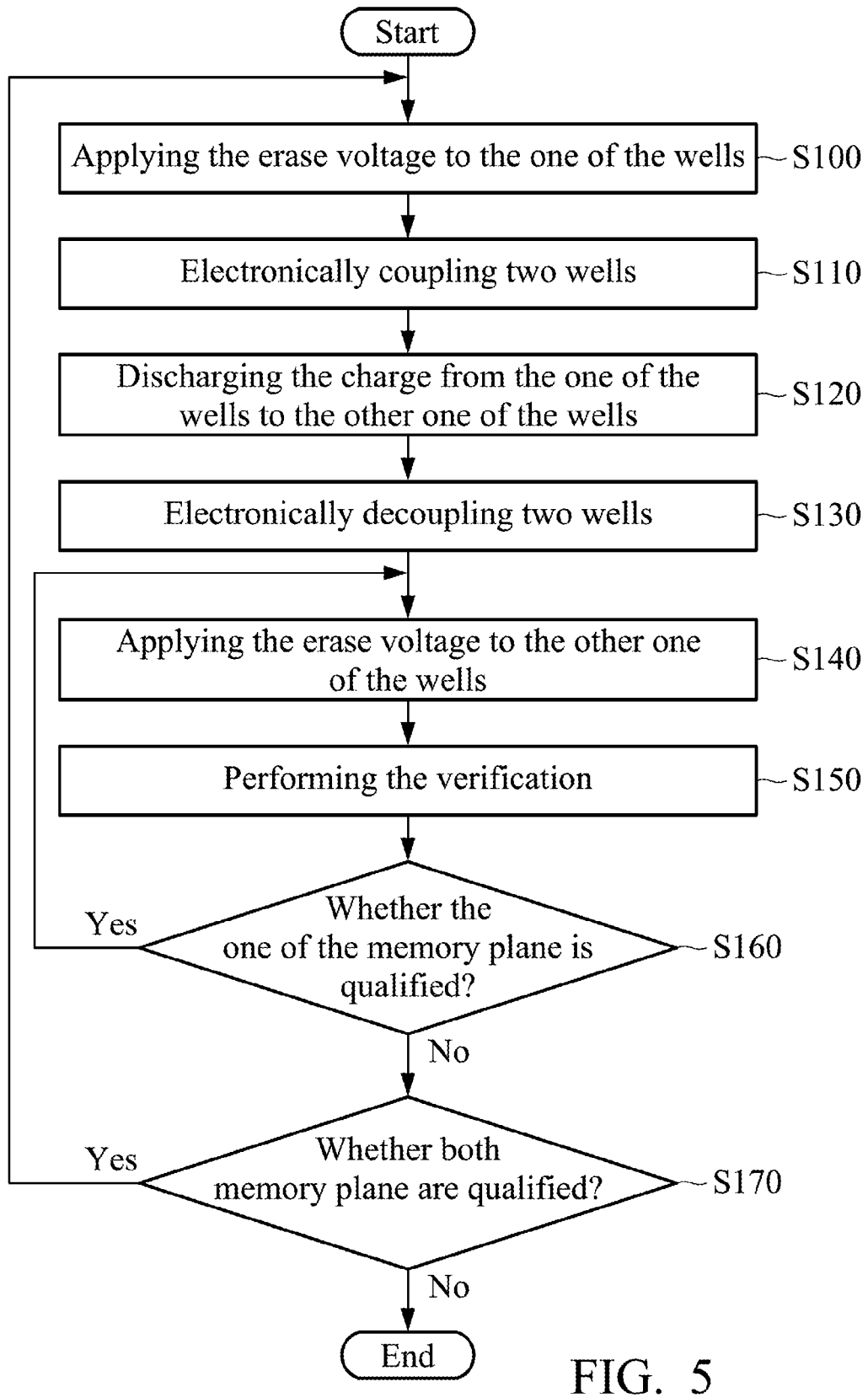
FIG. 5 illustrates a flowchart for explaining the erase operation of the flash memory in accordance with an embodiment of the invention.

Next, the erase operation related to the first embodiment of the present invention will be described in FIG. 5. When the controller 150 receives an erase command transmitted from the external controller, an erase sequence is enabled in response to the erase command. Here, it is assumed that the selected blocks of the left and right memory planes 110L, 110R are erased.

Figure 6A:
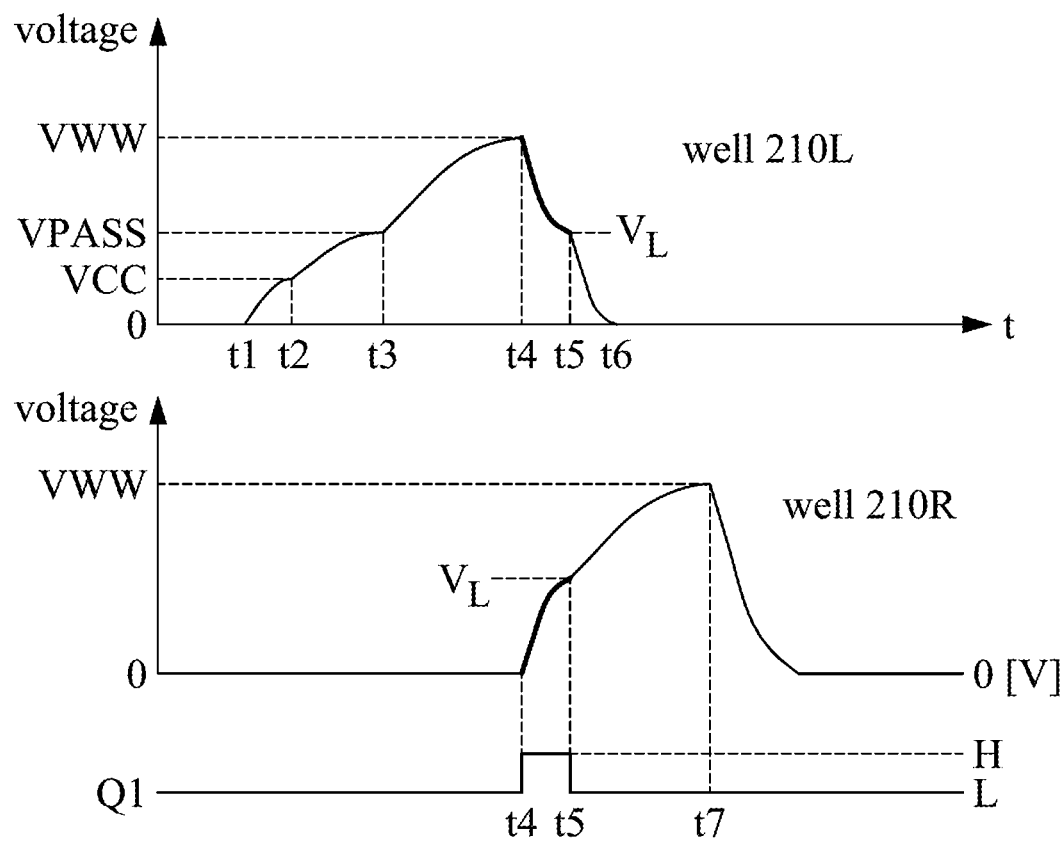
FIG. 6A illustrates a waveform of the erase voltage when performing the charge sharing between the plurality of wells.

By being controlled by the controller 150, the word line selecting circuit 160 applies 0V to the word line of the selected block, and sets the word line of the unselected block to the float state. In the P-well (such as the well 210L) of one memory plane, the erase voltage is applied by the voltage circuit 220L (S100). At this point, the transistor Q1 is in the "off" state, and the well 210L and the well 210R are electrically insulated (isolated). FIG. 6A illustrates the waveform when the erase voltage is applied to the well 210L. At time t1, the transistor Q3 turns on, and Vcc voltage is applied to the well 210L; at time t2, the transistor Q4 turns on, and VPASS voltage is applied to the well 210L; at time t3, the transistor Q5 turns on, high voltage WWW for the erase operation is applied to the well 210L. During time t3 and t4, the erase of the selected block of the memory plane 110L is performed.

Next, between time t4 to t5, the transistor Q1 turns on, and one of the wells 210L and the other one of the wells 210R are electrically coupled (S110). In this way, the charge charged in the P-well 210L are discharged to the P-well 210R, and the erase voltage is shared by the two wells 210L and 210R, which makes the voltages $V_L$ of the well 210L and 210R become approximately equal (S120). For example, when the high voltage WWW is about 20V and charge loss is zero, and the voltage $V_L$ of each well 210L, 210R is about 10V.

Thereafter, at time t5, the transistor Q1 is in the "off" state, and the two P-wells 210L, 210R are electrically insulated (S130). When the transistor Q1 is in the "off" state, and the transistor Q2 of the voltage circuit 220L turns on, the charge in the well 210L is discharged to GND. At time t6, the voltage of the well 210L becomes 0V. On the one hand, the erase voltage is applied to the well 210R by the voltage circuit 220R (S140), in which the well 210R has been boosted to $V_L$ by the charge sharing. In a preferred embodiment, the transistor Q8 or Q9 of the voltage circuit 220R can be turned on to provide a voltage greater than the voltage $V_L$ to the well 210R. Thereby, during time t5 and t7, the erase operation of the selected block of the memory plane 110R is performed.

Next, the erase verification of the selected block of the memory 110L, 110R is performed (S150). In the erase verification, a precharge voltage is applied to each NAND string from a common source line, and a verify voltage is applied to all of the word lines of the selected block to perform the verification readout. A page buffer/sensing circuit 170 keeps the result of the verification readout at the sensing node. If all of the bit lines (NAND strings) of the page buffer/sensing circuit 170 are at the H-level, they are determined to be qualified. If any bit line is at the L-level, they are determined to be unqualified (S160).

Based on the results of the verification, the controller 150 executes the erase operation related to the unqualified memory plane when any memory plane is determined to be unqualified. For example, when the erase of the selected block of the memory plane 110L is determined to be unqualified, the erase voltage is applied only to the P-well 210L, and the erase operation is repeated until the erase verification is qualified. At this time, the transistor Q1 is in the "off" state, and the charge sharing between the wells is not performed. When the erase verification of the selected block of the two memory planes are qualified (S170), the erase operation ends.

Figures 6B, 7:
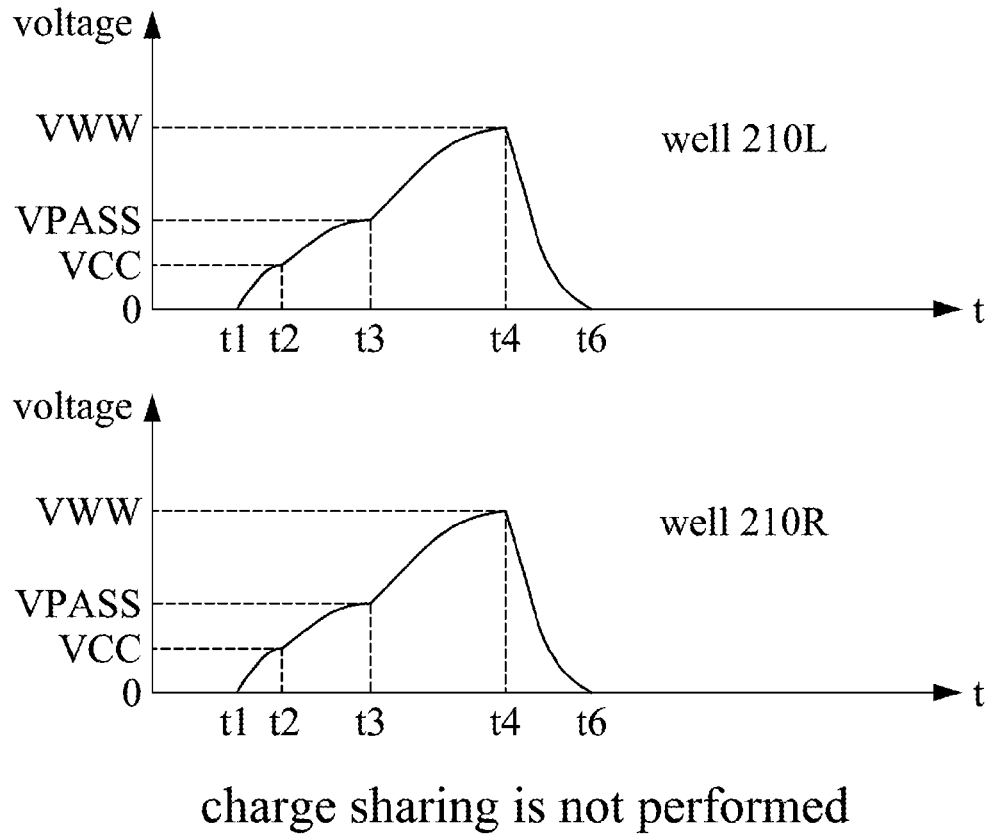
FIG. 6B illustrates the waveform of the erase voltage without performing the charge sharing between the plurality of wells.
FIG. 7 illustrates the erase operation of the flash memory in accordance with the second embodiment of the invention.

FIG. 6B illustrates the waveform of the erase voltage of the wells 210L, 210R when the charge sharing is not performed. When the charge sharing is not performed, the voltage circuits 220L, 220R simultaneously apply the erase voltages to the respective wells 210L, 210R, and the erase of the selected block is performed during time t3 to t4. After that, the wells 210L, 210R are discharged to GND. At time t6, after the voltage of the well becomes 0V, the erase verification of the two memory planes are performed simultaneously.

When charge sharing is not performed, the voltage circuits 220L and 220R in each well 210L, 210R require a higher drive power than usual because the erase voltage is applied to the state of 0V or GND level. In addition, the erase voltage applied to the well will be discharged to GND and then be applied again, so that power consumption is increased. On the other hand, in the embodiment, when the charge sharing is performed between the wells, the erase voltage applied to the well is discharged to the next well which should be erased, and then the voltage is boosted to the high voltage WWW. Because the consumed voltage is reused rather that completely discharged to GND, the power consumption can be restricted. Furthermore, the erase method of the embodiment does not erase the two memory planes at the same time. Although the erase of the other memory plane is performed after the erase of the one of the memory planes is performed, which makes the total time of the erase longer. However, since the erase usually needs a longer time (such as within 1 millisecond), even if the erase of the selected block of the two memory planes are not performed at the same time, but in the embodiment, the erases can be completed within the required time, there will be no other problems. In addition, since the wells having the charge sharing have been charged from the voltage $V_L$ to the high voltage WWW, the boosting time can be shortened compared with the well boosted from 0V.

Next, a second embodiment of the present invention will be described. In the first embodiment, the erase verification of the two memory planes is performed at the same time after the erase of the selected blocks of the two memory planes is performed. In the second embodiment, the erase verification of another one of the memory planes is performed while the erase of the one of the memory planes is performed, and the erase verification of the one of the memory planes is performed while the erase of another one of the memory planes is performed. FIG. 7 illustrates an outline of the erase method of the second embodiment. For example, during a certain period of time TP1, the erase of the memory plane 110L is performed while the erase verification of the memory plane 110R is performed, and during the next period of time TP2, the erase verification of the memory plane 110L is performed while the erase of the memory plane 110R is performed. Assuming that at time period TP2, if the erase verification of the memory plane 110L is qualified, the erase/erase verification of the memory plane 110R is repeated from time period TP3.

Figure 8:
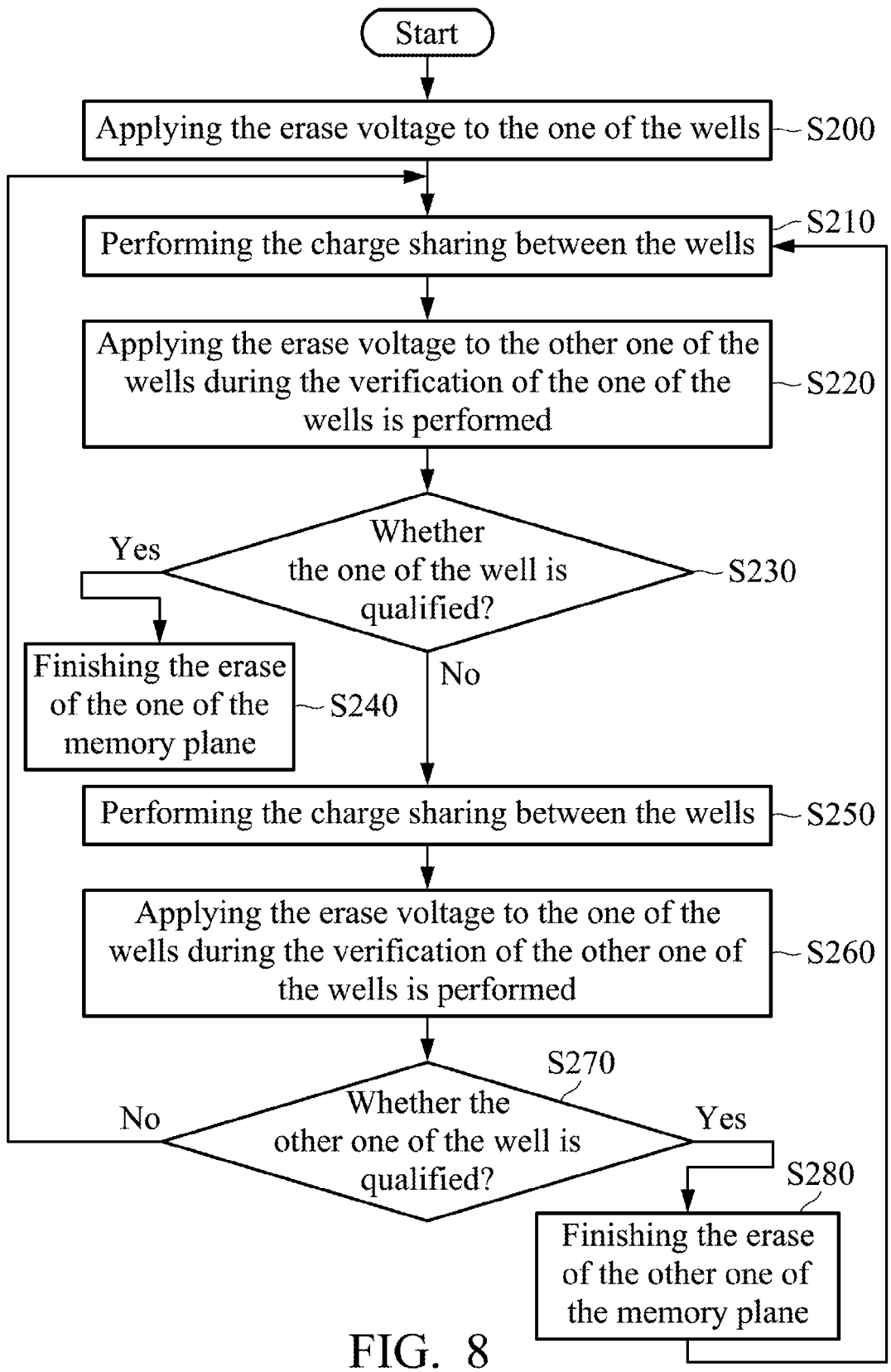
FIG. 8 illustrates a flowchart of the erase operation of the flash memory in accordance with the second embodiment of the invention.

FIG. 8 is a flowchart of an erase operation of the erase operation of the second embodiment. First, an erase voltage is applied to one of the wells (e.g., the p-well) (S200) for performing the erase of the selected block of the memory plane 110L. Then, the transistor Q1 is turned on for a certain period of time, and it is the same as the first embodiment, and the erase voltage is shared between the wells 210L and 210R (S210).

Next, the P-well 210L is discharged to GND by the transistor Q2 of the voltage circuit 220L, and the P-well 210R is boosted to the high voltage WWW by the transistors Q7 to Q9 of the voltage circuit 220R. At this time, the erase verification of the selected blocks of the memory plane 110L is performed by applying 0V to all the word lines of the selected block through the word line selecting circuit 160, and the erase of the selected blocks of the memory plane 110R is performed during the same period (S220).

The controller 150 determines whether the erase verification of the memory plane 110L is qualified (S230). If the erase verification is qualified, the controller 150 stops the erase of the memory plane 110L (S240). When the erase verification of the memory plane 110L is unqualified, the erase voltage is shared again between the wells (S250). Next, the P-well 210R is discharged to GND, the P-well 210L is applied with the high voltage WWW, the erase verification of the selected block of the memory plane 110R is performed, and the selected block of the memory plane 110L is erased (S260). The controller 150 determines whether the erase verification of the memory plane 110R is qualified (S270), and if it is qualified, the controller 110 stops the erase of the memory plane 110R (S280). Then, the method returns to step S210.

According to the second embodiment, since the erase verification of another one of the memory planes is performed while the erase operation is performed on one of the memory planes, the total time of the erase operation can be shortened compared with the first embodiment.

Figure 4:
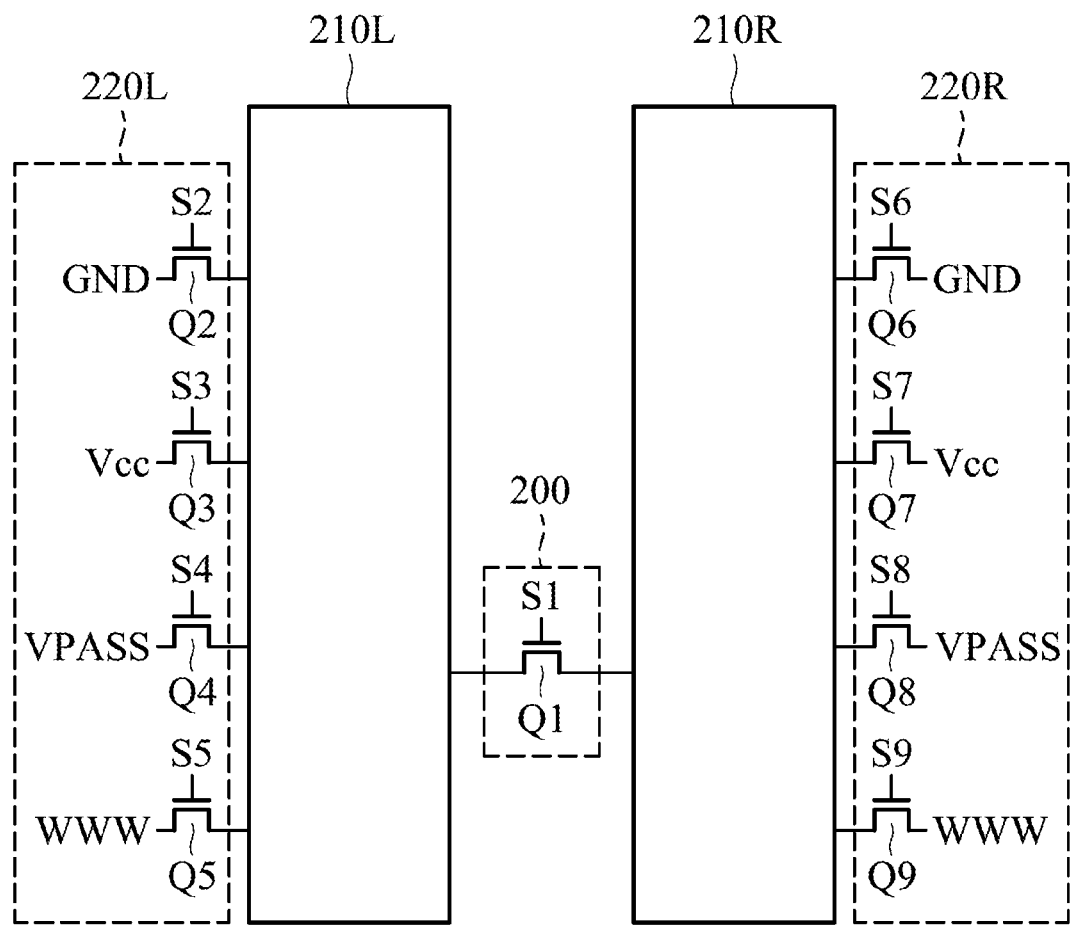
FIG. 4 illustrates a circuit diagram for performing charge sharing between the plurality of wells of the flash memory in accordance with an embodiment of the invention.
Figures 9, 10:
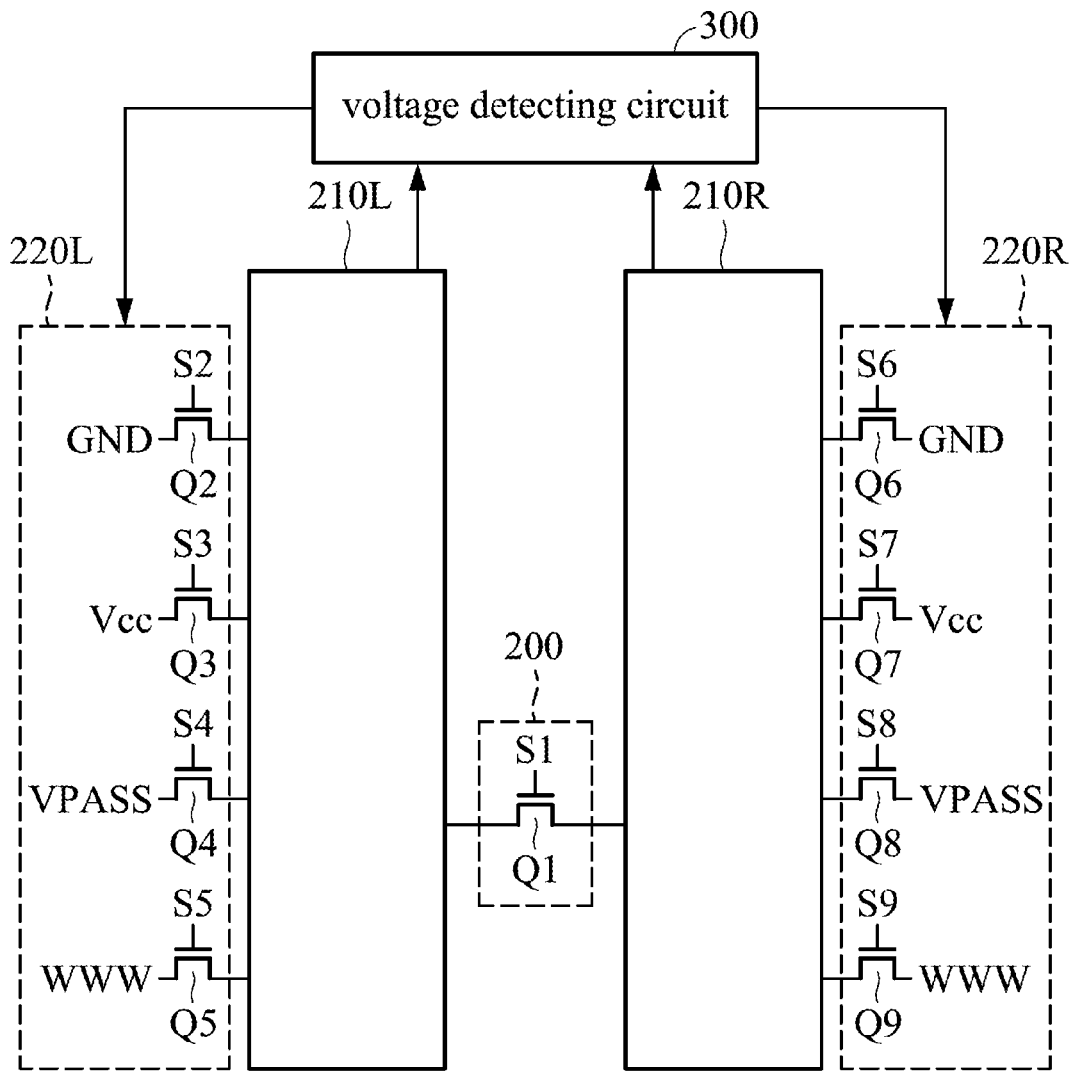
FIG. 9 illustrates a circuit diagram for performing charge sharing between the wells of the flash memory in accordance with a third embodiment of the invention.
FIG. 10 illustrates a graph of control contents of the voltage circuit in accordance with the third embodiment of the invention.

Next, a third embodiment of the present invention will be described. FIG. 9 illustrates a circuit structure of the third embodiment when the charge sharing is performed, and the elements which are the same as those shown in FIG. 4 are labeled with the same symbols or numerals. The third embodiment includes a voltage detecting circuit 300 for detecting the voltage of the wells 210L and 210R. By using the voltage detecting circuit 300, when the charge charged in the one of the wells is discharged to another one of the wells, the voltage of the other one of the wells is detected, and the voltage circuit 220L/220R is controlled based on the detected voltage. For example, when the charge charged in well 210L is discharged to well 210R, the voltage detecting circuit 300 detects the voltage $V_W$ of the well region 210R, and controls the actions of the transistors Q7, Q8, Q9 based on the detected voltage $V_W$.

FIG. 10 illustrates the specific control content of the voltage circuit 220L/220R. For example, taking the well 210R of FIG. 6A as an example, at time t5, when the wells share the charge, the voltage detecting circuit 300 detects the voltage $V_W$ (=VL) of the well 210R. The voltage detecting circuit 300 selects an initial transistor which allows it to be operated in the voltage circuit 220R based on the detected voltage Vw. That is, if the detected voltage $V_W$ is greater than 0V and less than Vcc voltage, the transistor Q7 turns on; if the detected voltage $V_W$ is greater than Vcc voltage, the transistor Q8 turns on; if the detected voltage $V_W$ is greater than VPASS voltage, the transistor Q9 turns on. Thereafter, the voltage of the well 210R is monitored, and the transistor which boosts the voltage is sequentially selected based on the monitored voltage, and finally, the high voltage WWW is applied.

It is assumed that if the voltage supplied by the selected transistor is lower than the voltage $V_L$ of the well when charge sharing is performed, the voltage $V_L$ of the well discharges to the voltage supply source of the voltage circuit 220L/220R, which means that shared power cannot be used again and is wasted. According to the third embodiment, since the optimum transistor of the voltage circuit 220L/220R is selected to supply the voltage to the well when charge sharing is performed, the time for boosting the well to the high voltage WWW is shortened, and wastage of the sharing charge can be controlled.

The voltage circuits 220L/220R of the embodiment include the transistors Q3/Q7, Q4/Q8, Q5/Q9 for applying Vcc, VPASS, WWW voltages, but this is only an example, and the voltage circuit 220L/220R may further include transistors other than the above capable of applying the voltages.

Figure 11:
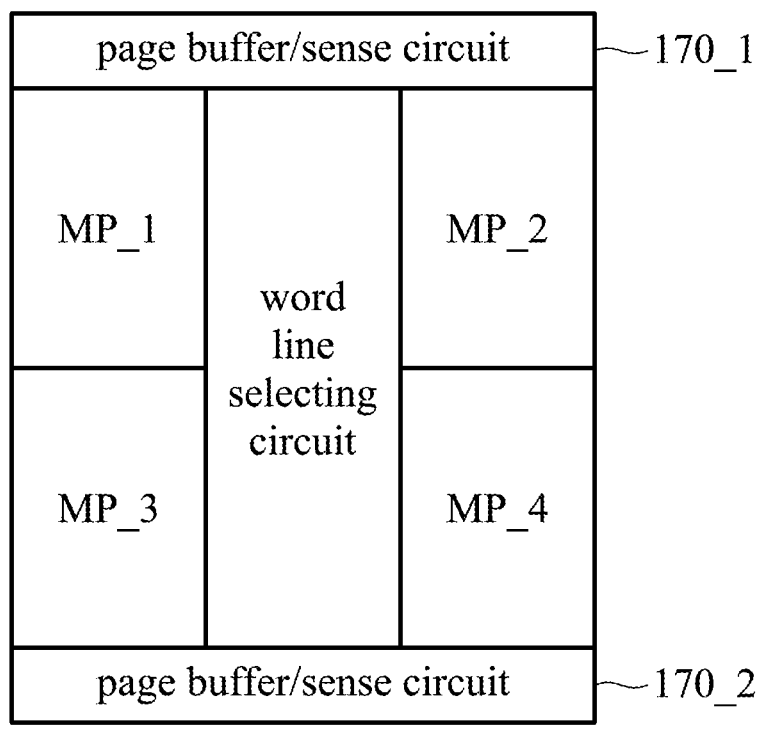
FIG. 11 illustrates the structure of the flash memory in accordance with the variation of the invention.

The flash memory of the embodiment includes two memory planes, but the number of memory planes (i.e., the number of wells) is not limited thereto. For example, as shown in FIG. 11, two different memory planes (total four memory planes MP_1, MP_2, MP_3, MP_4) may be formed on both sides of the word line selecting circuit 160. In this case, two page buffer/sense circuits 170_1, 170_2 are provided, the page buffer/sensing circuit 170_1 is connected to the memory planes MP_1, MP_2, page buffer/sensing circuit 170_2 is connected to the memory planes MP_3, MP_4. Furthermore, although the flash memory of the embodiment is exemplified by the NAND-type, the present invention can be applied to the NOR-type flash memory.

As described above, preferred embodiments of the present invention are described in detail, but it is not limited to the specific embodiments, and various modifications and variations are possible within the scope of the present invention as set forth in the appended claims.

What is claimed is:

1. An erase method for a flash memory, wherein the flash memory comprises a plurality of wells with memory cells formed therein, comprising:
    applying erase voltages to one of the wells;
    discharging the erase voltages from the one of the wells to the other one of the wells electrically coupled with the one of the wells;
    applying the erase voltage to the other one of the wells; and
    performing an erase verification to the memory cells formed in the one of the wells and the memory cells formed in the other one of the wells at the same time.

2. The erase method as claimed in claim 1, comprising:
    electrically decoupling qualified wells and unqualified wells and applying the erase voltage to the unqualified wells when the erase verification of any one of the wells is qualified.

3. The erase method as claimed in claim 1, comprising:
    detecting a voltage of the other one of the wells applied with the erase voltage discharging from the one of the wells; and
    selecting a power supply source for applying the erase voltage to the other one of the wells based on the detected voltage.

4. An erase method for a flash memory, wherein the flash memory comprises a plurality of wells with memory cells formed therein, comprising:
    applying an erase voltage to one of the wells;
    discharging the erase voltage from the one of the wells to the other one of the wells electrically coupled with the one of the wells; and
    applying the erase voltage to the other one of the wells and performing an erase verification on the one of the wells during the same period.

5. The erase method as claimed in claim 4, comprising:
    electrically decoupling qualified wells and unqualified wells and applying the erase voltage to the unqualified wells when the erase verification of any one of the wells is qualified.

6. The erase method as claimed in claim 5, wherein when the erase verification of the one of the wells is unqualified, further comprising:
    electrically coupling the one of the wells and the other one of the wells again for discharging the erase voltage of the other one of the wells to the one of the wells; and
    performing the erase verification on the other one of the wells and applying the erase voltage to the one of the wells again during the same period.

7. The erase method as claimed in claim 4, further comprising:
    detecting the voltage of the other one of the wells applied with the erase voltage discharging from the one of the wells; and
    selecting a power supply source for applying the erase voltage to the other one of the wells based on the detected voltage.

8. A flash memory device, comprising:
    a plurality of wells, comprising a plurality of memory cells;
    a detecting device, detecting a voltage of a selected one of the wells;
    a power supply device, applying an erase voltage to the selected one of the wells; and
    a coupling device, performing selective couplings between the plurality of wells;
    wherein when performing an erase operation on the wells, the power supply device applies the erase voltage to one of the wells, and applies the erase voltage to the other one of the wells based on the detected voltage of the other one of the wells after the coupling device electrically couples the one of the wells to the other one of the wells.

9. The flash memory device as claimed in claim 8, further comprising:
    a control device, applying a control signal to the coupling device, the coupling device comprises at least one transistor connecting the one of the wells to the other one of the wells, and when the transistor is turned on according to the control signal for a certain period of time after the erase voltage is applied to the one of the wells, the erase voltage of the one of the wells is discharged to the other one of the wells.

10. The flash memory device as claimed in claim 8, wherein:
    the power supply device comprises a plurality of transistors connecting to a plurality of power supply sources, and applies a selected voltage from one of the power supply sources to the selected one of the wells according to the control signal.

11. The flash memory device as claimed in claim 8, wherein the memory cells formed in the one of the wells and the memory cells formed in the other one of the wells are connected by a common word line.

12. The flash memory device as claimed in claim 8, wherein while the power supply device is applying the erase voltage to the other one of the wells, an erase verification of the one of the wells is performed.

* * * * *